(12) United States Patent
Adachi et al.

(10) Patent No.: US 11,664,796 B2
(45) Date of Patent: May 30, 2023

(54) DRIVER CIRCUIT AND SEMICONDUCTOR DEVICE

(71) Applicant: FUJI ELECTRIC CO., LTD., Kawasaki (JP)

(72) Inventors: Shinichiro Adachi, Matsumoto (JP); Hirohisa Arai, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/585,180

(22) Filed: Jan. 26, 2022

(65) Prior Publication Data

US 2022/0302914 A1 Sep. 22, 2022

(30) Foreign Application Priority Data

Mar. 17, 2021 (JP) .............................. JP2021-043352

(51) Int. Cl.
- *H02M 1/08* (2006.01)
- *H03K 17/567* (2006.01)
- *H02M 7/5387* (2007.01)
- *H02P 27/08* (2006.01)

(52) U.S. Cl.
CPC ............ *H03K 17/567* (2013.01); *H02M 1/08* (2013.01); *H02M 7/53871* (2013.01); *H02P 27/08* (2013.01)

(58) Field of Classification Search
CPC ..... H02M 1/08; H02M 7/53871; H02P 27/08; H03K 17/567

USPC .................................. 327/108, 109, 110, 111
See application file for complete search history.

(56) References Cited

U.S. PATENT DOCUMENTS

| | | | | |
|---|---|---|---|---|
| 2009/0002054 A1* | 1/2009 | Tsunoda | ................ | H03K 17/063 327/374 |
| 2014/0062541 A1* | 3/2014 | Wasekura | ........... | H03K 17/6877 327/109 |
| 2014/0253184 A1* | 9/2014 | Yamauchi | ......... | H03K 17/08128 327/109 |
| 2015/0236686 A1* | 8/2015 | Senda | ..................... | H03K 17/60 327/381 |
| 2016/0352316 A1* | 12/2016 | Akama | ............... | H03K 17/6871 |
| 2016/0380563 A1* | 12/2016 | Fukuta | ............... | H02M 7/53871 318/400.3 |
| 2022/0182004 A1* | 6/2022 | Heckroth | .......... | H03K 17/08128 |
| 2022/0182052 A1* | 6/2022 | Heckroth | ............ | H03K 17/0828 |

FOREIGN PATENT DOCUMENTS

| | | |
|---|---|---|
| JP | 2008-199821 A | 8/2008 |
| JP | 2012-039460 A | 2/2012 |
| JP | 2016-174455 A | 9/2016 |

* cited by examiner

*Primary Examiner* — William Hernandez
(74) *Attorney, Agent, or Firm* — Rabin & Berdo, P.C.

(57) ABSTRACT

A driver circuit for driving a switching device having a control electrode. The driver circuit includes an ON circuit configured to turn on the switching device in response to a first drive signal, and an OFF circuit configured to discharge a parasitic capacitance of the control electrode of the switching device with a constant current, to turn off the switching device, in response to a second drive signal.

10 Claims, 5 Drawing Sheets

DRIVER CIRCUIT AND SEMICONDUCTOR DEVICE

CROSS-REFERENCE TO RELATED APPLICATION

The present application claims priority pursuant to 35 U.S.C. § 119 from Japanese patent application number 2021-043352 filed on Mar. 17, 2021, the entire disclosure of which is hereby incorporated by reference herein.

BACKGROUND

Technical Field

The present disclosure relates to a driver circuit and a semiconductor device.

Description of the Related Art

There have been driver circuits to reduce switching loss in a switching device (for example, insulated gate bipolar transistor (IGBT)) (for example, see Japanese Patent Application Publication Nos. 2008-199821, 2012-039460, and 2016-174455).

For example, when an IGBT is driven by constant voltage drive to be turned off, a current flows from a collector electrode to a gate electrode through a Miller capacitance due to a change in a collector-emitter voltage during Miller period. In such a case, it is difficult to control the current flowing to the gate electrode. Accordingly, when the IGBT is driven by constant voltage drive, it is difficult to shorten the Miller period. In addition, when the Miller period is long, the amount of change in the collector-emitter voltage per hour results in being small. This may increase switching loss in a switching device (for example, IGBT).

SUMMARY

A first aspect of an embodiment of the present disclosure is a driver circuit for driving a switching device having a control electrode, comprising: an ON circuit configured to turn on the switching device in response to a first drive signal; and an OFF circuit configured to discharge a parasitic capacitance of the control electrode of the switching device with a constant current, to turn off the switching device, in response to a second drive signal.

A second aspect of an embodiment of the present disclosure is a semiconductor device, comprising: a switching device having a control electrode; an ON circuit configured to turn on the switching device in response to a first drive signal; and an OFF circuit configured to discharge a parasitic capacitance of the control electrode of the switching device with a constant current, to turn off the switching device, in response to a second drive signal.

DETAILED DESCRIPTION

At least following matters will become apparent from the descriptions of the present specification and the accompanying drawings.

Embodiment

Motor Control System 10

Figure 1:
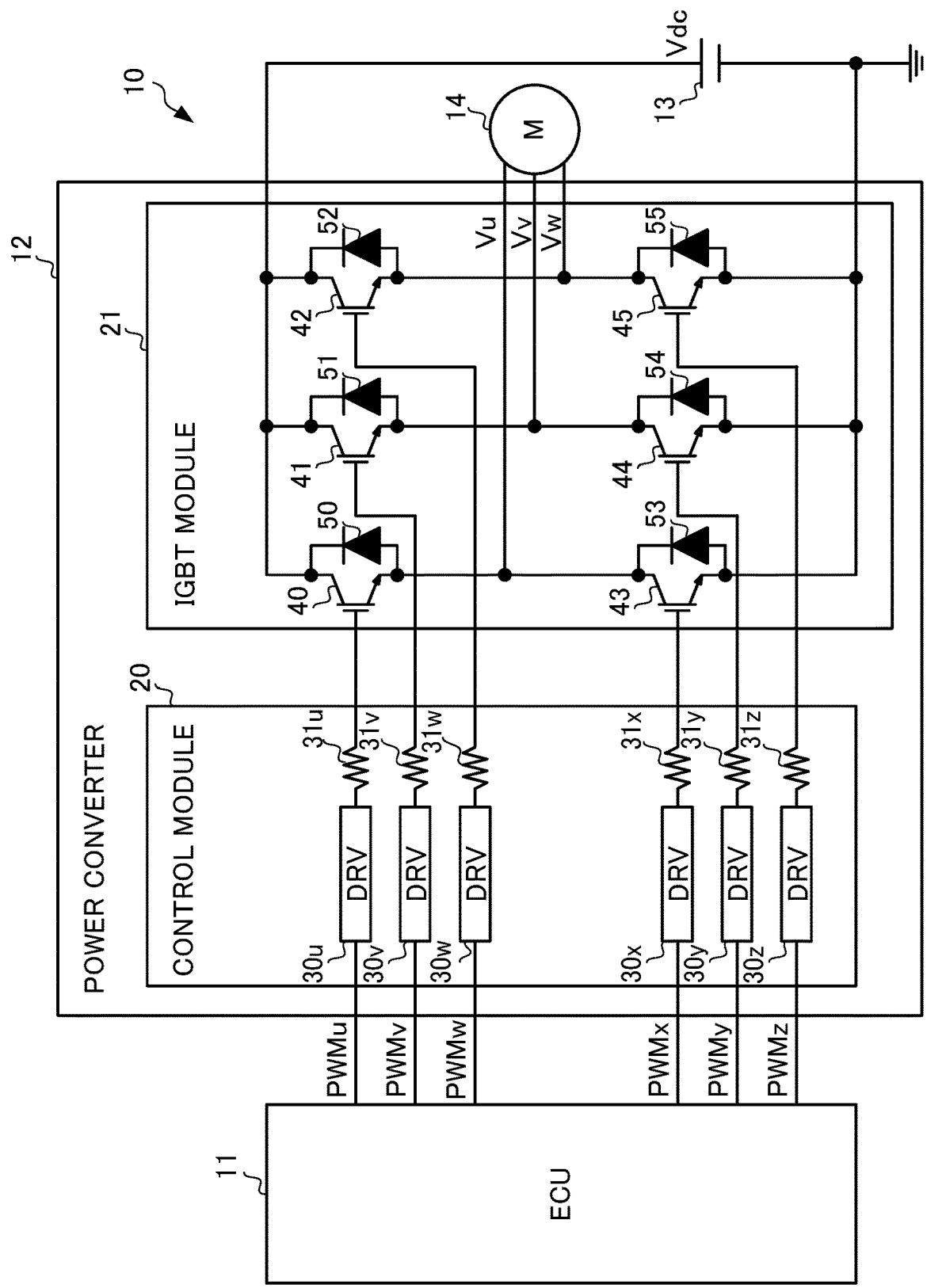
FIG. 1 is a diagram illustrating an example of a configuration of a motor control system 10.

FIG. 1 is a diagram illustrating an example of a configuration of a motor control system 10 which is an embodiment of the present disclosure. The motor control system 10 controls a motor (for example, a three-phase motor 14), and includes an electronic control unit (ECU) 11, a power converter 12, and a direct-current (DC) power supply 13.

The ECU 11 is a computer to control the three-phase motor 14, and outputs signals PWMu, PWMv, PWMw, PWMx, PWMy, and PWMz to control the number of revolutions of the three-phase motor 14.

The power converter 12 is a device to convert a direct-current (DC) voltage Vdc (for example, 400 V) outputted by the DC power supply 13 to three-phase alternating-current (AC) voltages Vu, Vv, and Vw in response to the signals PWMu to PWMz. In addition, the power converter 12 drives the three-phase motor 14 by the three-phase AC voltages Vu, Vv, and Vw. The power converter 12 includes a control module 20 and an insulated gate bipolar transistor (IGBT) module 21. Note that the power converter 12 corresponds to a "semiconductor device".

The control module 20 drives IGBTs 40 to 45 in the IGBT module 21 (described later) in response to the signals PWMu to PWMz, respectively.

The control module 20 includes driver circuits (DRV) 30u, 30v, 30w, 30x, 30y, and 30z and resistors 31u, 31v, 31w, 31x, 31y, and 31z. In an embodiment of the present disclosure, the control module 20 includes not only the driver circuits 30u to 30z and the resistors 31u to 31z but also a DC/DC converter (not illustrated) to output a power supply voltage Vcc (described later).

The driver circuit (DRV) 30u drives the IGBT 40 in response to the signal PWMu. In specific, in order to turn on the IGBT 40, the driver circuit 30u drives the IGBT 40 by a drive voltage Vdru through the resistor 31u in response to the signal PWMu at a high level (hereinafter, referred to as high or high level). On the other hand, in order to turn off the IGBT 40, the driver circuit 30u discharges a parasitic capacitance of the IGBT 40 with a constant current Ioff through the resistor 31u in response to the signal PWMu at a low level (hereinafter, referred to as low or low level). The same applies to each of the driver circuits 30v to 30z.

Each of the driver circuits 30u to 30z is configured with a similar circuit. Thus, in an embodiment of the present disclosure, the driver circuit 30x that drives the IGBT 43 on the ground side, among the driver circuits 30u to 30z, will be described below in detail.

The IGBT module 21 is driven by the control module 20 through the resistors 31u to 31z, which are gate resistors of the IGBTs 40 to 45, respectively, and generates the three-phase AC voltages Vu to Vw from the DC voltage Vdc. The IGBT module 21 includes the IGBTs 40 to 45 and freewheeling diodes (FWDs) 50 to 55. The IGBTs 40 to 45 are switched by drive voltages Vdru to Vdrz, respectively. The FWDs 50 to 55 are coupled in antiparallel with the IGBTs 40 to 45, respectively.

The IGBTs 40 and 43 are U-phase switching devices that generate the voltage Vu, and the IGBTs 41 and 44 are V-phase switching devices that generate the voltage Vv. The IGBTs 42 and 45 are W-phase switching devices that generate the voltage Vw.

In an embodiment of the present disclosure, the IGBT 40 is illustrated as if they are a single component by being combined with the FWD 50. However, in order to pass a larger current, multiple combinations each combining an IGBT and an FWD may be coupled in parallel and may be driven by the drive voltage Vdru, for example. The same applies to the respective combinations of the IGBTs 41 to 45 and the FWDs 51 to 55.

The three-phase motor 14 generates power according to the three-phase AC voltages Vu to Vw. The three-phase motor 14 is, for example, an in-vehicle motor or a motor for air conditioner.

Relationship Between Voltage Vge and Gate Current Ig when IGBT 46 is Driven by Constant Voltage Drive to be Turned Off In an embodiment of the present disclosure, in order to turn on the IGBT 43, the driver circuit 30x is driven by the drive voltage Vdrx, and in order to turn off the IGBT 43, the driver circuit 30x discharges a parasitic capacitance of the IGBT 43 with the constant current Ioff. For comparison, a driver circuit 30a that turns on and off an IGBT 46 by a drive voltage Vdra will be described below.

Figure 2A:
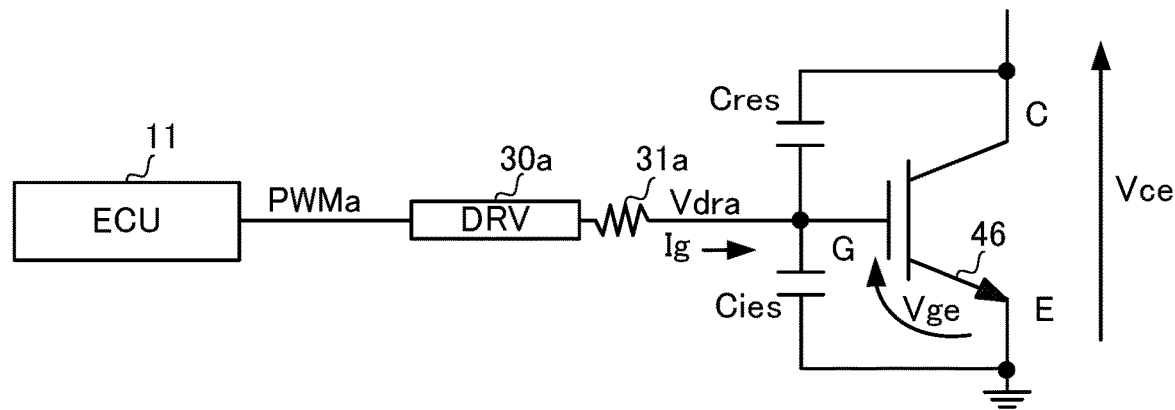
FIG. 2A is a schematic diagram of a circuit configuration to drive an insulated gate bipolar transistor (IGBT) 46.
Figure 2B:
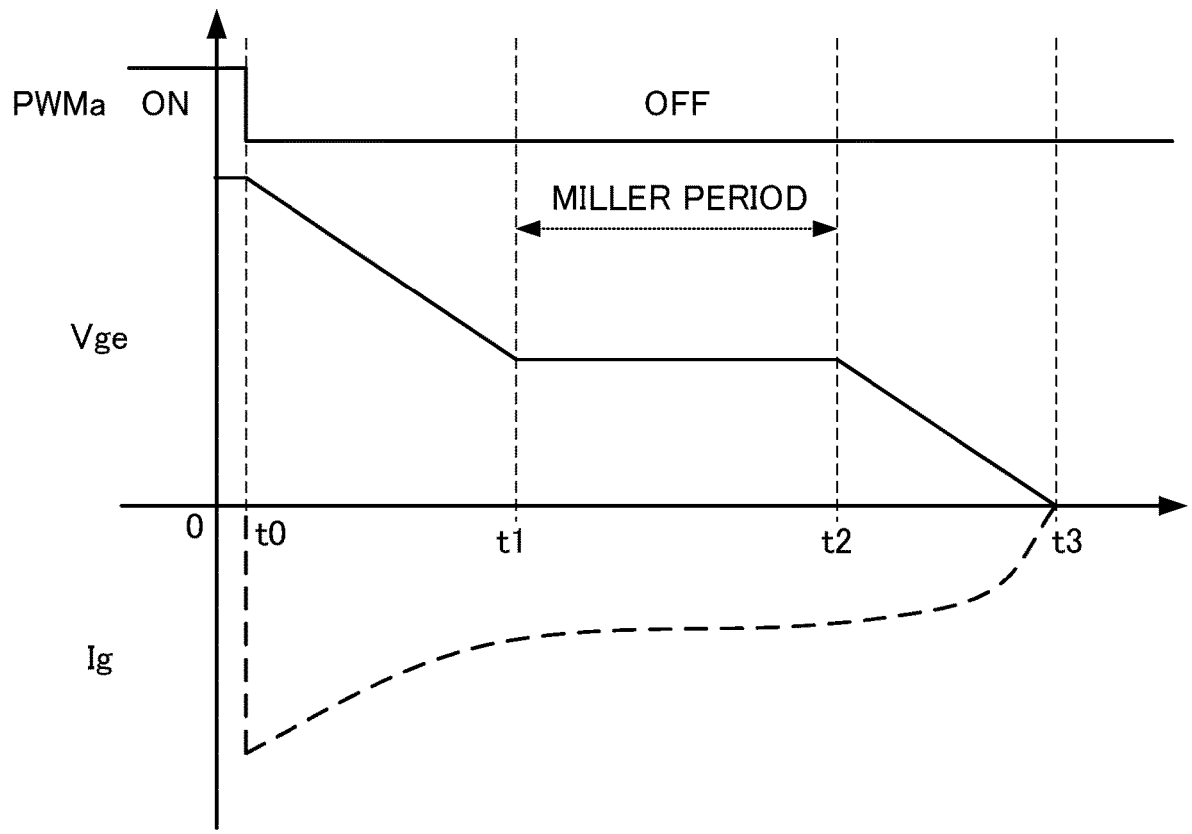
FIG. 2B is a diagram illustrating a relationship between a voltage Vge and a gate current Ig when an IGBT 46 is turned off in a case where the IGBT 46 is driven by constant voltage drive.

FIG. 2A is a schematic diagram of a circuit configuration for comparison that drives the IGBT 46. FIG. 2B is a diagram illustrating a relationship between a voltage Vge and a gate current Ig when the IGBT 46 is driven by constant voltage drive to be turned off.

In FIG. 2A, the ECU 11 outputs a signal PWMa. The driver circuit 30a drives the IGBT 46 by constant voltage drive and applies the drive voltage Vdra to a gate electrode G of the IGBT 46 through a resistor 31a, in response to the signal PWMa. Note that the IGBT 46 is an IGBT similar to the IGBTs 40 to 45.

In the gate current Ig illustrated in FIG. 2B, it is assumed that the direction of the current flowing when an input capacitance Cies of the IGBT 46 is discharged is a positive direction. In other words, the gate current Ig for discharging the input capacitance Cies and a feedback capacitance Cres of the IGBT 46 is a current in a negative direction, and the larger the gate current Ig for discharging the input capacitance Cies and the feedback capacitance Cres is, the larger the current becomes in the negative direction.

With reference to FIG. 2A, an operation when the IGBT 46 is driven by constant voltage drive will be described below using FIG. 2B.

At time t0, in order to turn off the IGBT 46, the ECU 11 changes the signal PWMa from an ON signal to an OFF signal. At this time, the input capacitance Cies of the IGBT 46 starts to be discharged with the gate current Ig, and the voltage Vge of the IGBT 46 starts to drop.

At time t1, in response to drop in the voltage Vge, increase in the on resistance of the IGBT 46, and start of rise in the voltage Vce of the IGBT 46, a current flows to the driver circuit 30a through the feedback capacitance Cres of the IGBT 46 (i.e., a Miller capacitance), a gate electrode of the IGBT 46, and the resistor 31a. Thus, the drop in the voltage Vge starts to be suppressed, and the gate current Ig becomes substantially constant since the gate current Ig is determined according to a change in the voltage Vge. As a result, the voltage Vge does not change as given from time t1 to t2.

At time t2, in response to the voltage Vce becoming close to a constant voltage and the current passed through the feedback capacitance Cres decreasing, the voltage Vge starts to drop again. Note that the time period from time t1 to t2 is referred to as Miller period.

When the input capacitance Cies has been substantially discharged at time t3, the voltage Vge substantially reaches 0 V, and the IGBT 46 is completely turned off.

Incidentally, when the IGBT 46 is driven by constant voltage drive in response to the signal PWMa, it is difficult to control the current Ig. In specific, since the current passed through the feedback capacitance Cres flows through the resistor 31a and the driver circuit 30a, it is difficult to shorten the Miller period in which the voltage Vge is substantially constant.

Thus, the driver circuit 30x in an embodiment of the present disclosure drives the IGBT 43 by a constant current to turn it off, instead of driving the IGBT 43 by constant voltage drive to turn it off. This causes the driver circuit 30x in an embodiment of the present disclosure to increase dVce/dt at a time when turning off of the IGBT 43 is started, to thereby shorten the Miller period and also realize reduction in di/dt and switching loss. Hereinafter, in an embodiment of the present disclosure, the input capacitance Cies and the feedback capacitance Cres are referred to as "parasitic capacitance Cp".

Configuration of Driver Circuit 30x

Figure 3:
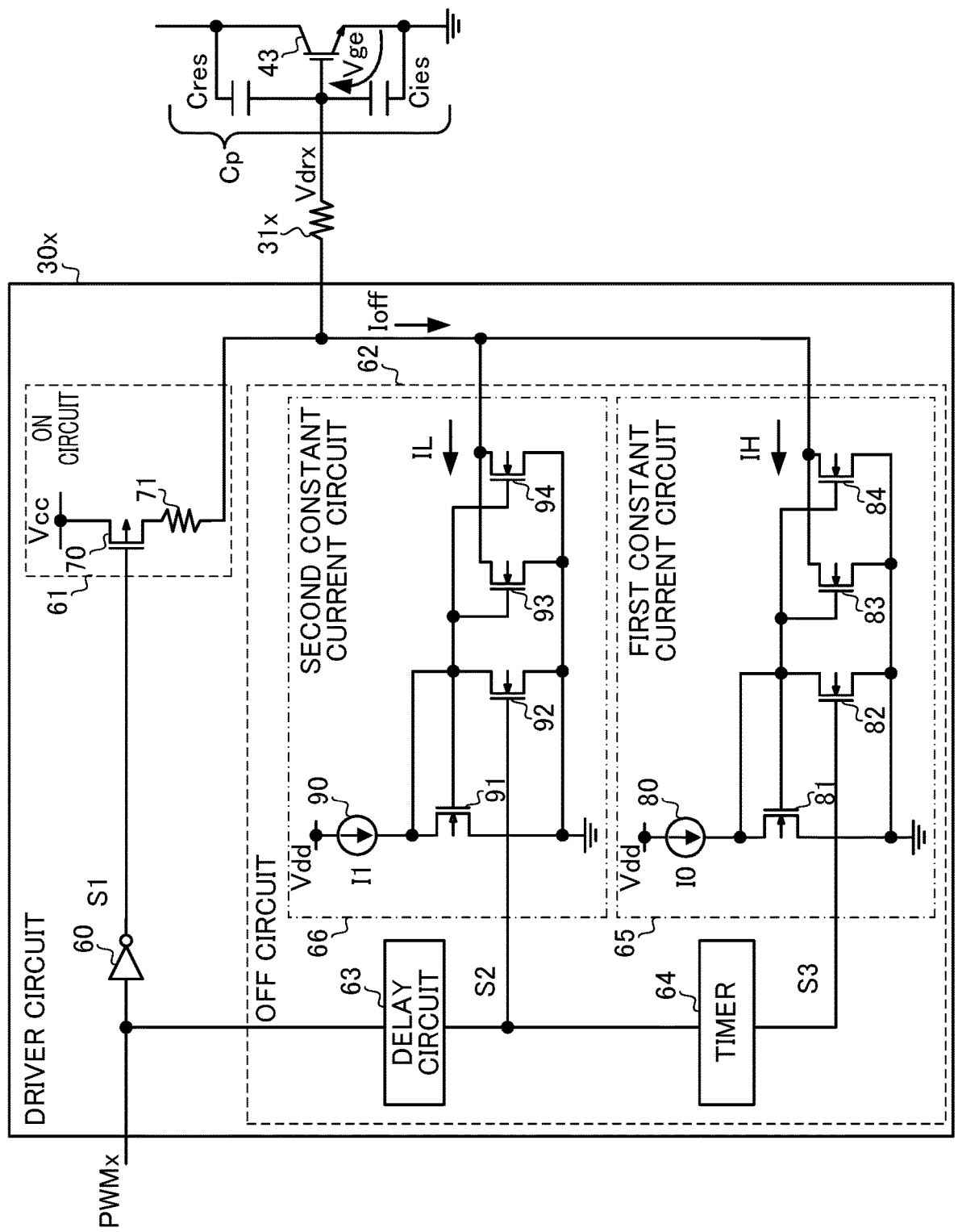
FIG. 3 is a diagram illustrating an example of a configuration of a driver circuit 30x.

FIG. 3 is a diagram illustrating an example of a configuration of the driver circuit 30x. The driver circuit 30x drives the IGBT 43 by the drive voltage Vdrx or the constant current Ioff through the resistor 31x. In specific, in response to the ECU 11 outputting the high signal PWMx, the driver circuit 30x outputs the drive voltage Vdrx to turn on the IGBT 43. On the other hand, in response to the ECU 11 outputting the low signal PWMx, the driver circuit 30x discharges the parasitic capacitance Cp of the IGBT 43 with the constant current Ioff to turn off the IGBT 43.

The driver circuit 30x includes an inverter 60, an ON circuit 61, and an OFF circuit 62.

The inverter 60 inverts a logic level of the signal PWMx outputted by the ECU 11. In specific, the inverter 60 outputs a low signal S1 in response to the high signal PWMx. Meanwhile, the inverter 60 outputs the high signal S1 in response to the low signal PWMx.

ON Circuit 61

The ON circuit 61 outputs the drive voltage Vdrx for turning on the IGBT 43 in response to the high signal PWMx, to thereby turn on the IGBT 43. In specific, the ON circuit 61 outputs the drive voltage Vdrx to turn on the IGBT 43 in response to the low signal S1. Meanwhile, the ON circuit 61 causes the output to be high impedance in response to the high signal S1.

The ON circuit 61 includes a P-channel metal-oxide-semiconductor (PMOS) transistor 70 and a resistor 71. The PMOS transistor 70 is provided between a node to receive the power supply voltage Vcc generated by the DC/DC converter (not illustrated) and the resistor 71, and is turned on or off in response to the signal S1.

The resistor 71 is a so-called gate resistor to reduce noise when the IGBT 43 is turned on. The resistor 71 is provided between the PMOS transistor 70 and the gate electrode of the IGBT 43, and in response to the PMOS transistor 70 being turned on, the resistor 71 applies the power supply voltage Vcc, as the drive voltage Vdrx, to the gate electrode of the IGBT 43 to turn on the IGBT 43.

Note that the high signal PWMx corresponds to a "first drive signal", and the low signal PWMx corresponds to a "second drive signal". The IGBT 43 corresponds to a "switching device". The gate electrode of the IGBT 43 corresponds to a "control electrode".

OFF Circuit 62

The OFF circuit 62 discharges the parasitic capacitance Cp, which is a parasitic capacitance of the gate electrode of the IGBT 43, with the constant current Ioff, to turn off the IGBT 43, in response to the low signal PWMx. In specific, the OFF circuit 62 discharges the parasitic capacitance Cp with the constant current Ioff in a time period T1 in response to the low signal PWMx, and then discharges, in a time period T2, the parasitic capacitance Cp with a constant current Ioff that is smaller than the constant current Ioff in the time period T1. The OFF circuit 62 includes a delay circuit 63, a timer 64, a first constant current circuit 65, and a second constant current circuit 66.

Delay Circuit 63

The delay circuit 63 generates a dead time in which neither the ON circuit 61 nor the OFF circuit 62 operates when the IGBT 43 changes from on to off. In specific, in response to the ECU 11 outputting the low signal PWMx, the delay circuit 63 delays it by a "predetermined time period D" and outputs a low signal S2. Meanwhile, in response to the ECU 11 outputting the high signal PWMx, the delay circuit 63 outputs a high signal S2.

Timer 64

The timer 64 measures time (for example, the time period T1 and the time period T2) in response to the low signal PWMx. In specific, the timer 64 measures the time period T1, which is a time period in which the later-described first constant current circuit 65 and second constant current circuit 66 operate, and a time period T2, which is a time period in which only the second constant current circuit 66 operates. The first constant current circuit 65, which is controlled by the timer 64, and the second constant current circuit 66, having a similar configuration as that of the first constant current circuit 65, will be described below prior to the timer 64 being described in detail.

First Constant Current Circuit 65

The first constant current circuit 65 operates to generate a current IH or stops operating, in response to a signal S3. In specific, the first constant current circuit 65 generates the current IH in response to the low signal S3, and discharges the parasitic capacitance Cp of the gate electrode of the IGBT 43 with the current IH. Meanwhile, the first constant current circuit 65 stops generating the current IH in response to the high signal S3.

The first constant current circuit 65 includes a constant current source 80 and N-channel metal-oxide-semiconductor (NMOS) transistors 81 to 84. The constant current source 80 receives a voltage Vdd generated from the power supply voltage Vcc by a reference voltage circuit (not illustrated), and passes a constant current I0.

The NMOS transistor 81 functions as a diode to pass the constant current I0, with a drain electrode thereof and a gate electrode thereof being coupled with each other.

The NMOS transistor 82 turns on the NMOS transistor 81 in response to the low signal S3. This causes the first constant current circuit 65 to generate the current IH. Meanwhile, the NMOS transistor 82 turns off the NMOS transistor 81 in response to the high signal S3. This causes the first constant current circuit 65 to stop generating the current IH.

The NMOS transistors 83 and 84 pass the current IH proportional to the current I0, according to a gate voltage of the NMOS transistor 81 at a time when the current I0 flows through the NMOS transistor 81. In specific, the NMOS transistors 83 and 84 pass the current IH according to the gate voltage of the NMOS transistor 81 at a time when the current I0 flows through the NMOS transistor 81, in response to the low signal S3. Meanwhile, the NMOS transistors 83 and 84 stop passing the current IH, upon the NMOS transistor 81 being turned off, in response to the high signal S3. The NMOS transistors 83 and 84 are provided between the gate electrode of the IGBT 43 and the ground.

Note that the constant current Ioff is the sum of the current IH passed by the first constant current circuit 65 and a current IL passed by the later-described second constant current circuit 66. In an embodiment of the present disclosure, the NMOS transistors 83 and 84 are given as an NMOS transistor that generates the current IH proportional to the current I0 flowing through the NMOS transistor 81. However, according to the relationship between the current I0 and the current IH, the current IH is not limited to being generated by the NMOS transistors 83 and 84, but the different number of NMOS transistors may generate the current IH proportional to the current I0. Further, it is assumed in an embodiment of the present disclosure that the current I0 is a constant current, however, the current I0 may vary in response to a signal from the outside and the like.

Second Constant Current Circuit 66

The second constant current circuit 66 operates to generate the current IL in response to the low signal S2. In specific, the second constant current circuit 66 generates the current IL in response to the low signal S2, and discharges the parasitic capacitance Cp of the IGBT 43 with the constant current IL. Meanwhile, the second constant current circuit 66 stops generating the current IL in response to the high signal S2. Note that the current IL is smaller than the current IH.

The second constant current circuit 66 includes a constant current source 90 and NMOS transistors 91 to 94. The constant current source 90 receives the voltage Vdd generated from the power supply voltage Vcc by the reference voltage circuit (not illustrated), and passes a constant current I1. The NMOS transistors 91 to 94 correspond to the NMOS transistors 81 to 84 of the first constant current circuit 65, respectively, and operate, similarly to the NMOS transistors 81 to 84, in response to the signal S2. The NMOS transistor 92 turns on the NMOS transistor 91 in response to the low signal S2.

Similarly to the first constant current circuit 65, in an embodiment of the present disclosure, the NMOS transistors 93 and 94 are given as an NMOS transistor that generates the current IL proportional to the current I1 flowing through the NMOS transistor 91. However, according to the relationship between the current I1 and the current IL, the current IL is not limited to being generated by the NMOS transistors 93 and 94, but the different number of NMOS transistors may generate the current IL proportional to the current I1. Further, it is assumed in an embodiment of the present disclosure that the current I1 is a constant current, however, the current I1 may vary in response to a signal from the outside and the like.

The current that is the sum of the current IH and the current IL corresponds to a "first constant current", and the current IL corresponds to a "second constant current". The NMOS transistors 83 and 84 correspond to a "first transistor", and the NMOS transistor 82 corresponds to a "first control circuit". The NMOS transistors 93 and 94 correspond to a "second transistor", and the NMOS transistor 92 corresponds to a "second control circuit".

The first constant current circuit 65 and the second constant current circuit 66 have been described above. The actual currents IH and IL generated by the first constant current circuit 65 and the second constant current circuit 66 change with the voltage level of the gate electrode of the IGBT 43. In specific, when the voltage of the gate electrode is high, and the NMOS transistors 83, 84, 93, and 94 operate in the saturation region, the currents IH and IL are constant currents. Meanwhile, when the voltage of the gate electrode is low, the NMOS transistors 83, 84, 93, and 94 operate in the linear region, and the currents IH and IL are not constant currents.

In an embodiment of the present disclosure, the first constant current circuit 65 and the second constant current circuit 66 "discharging" the parasitic capacitance Cp "with the currents IH and IL" includes not only the first constant current circuit 65 and the second constant current circuit 66 discharging it with the currents IH and IL, but also a state where the first constant current circuit 65 and the second constant current circuit 66 are operating to discharge the parasitic capacitance Cp with the constant currents IH and IL.

A configuration of the timer 64 and change in the constant current Ioff in association with an operation of the timer 64 will be described below with reference to FIGS. 4A and 4B.

Figure 4A:
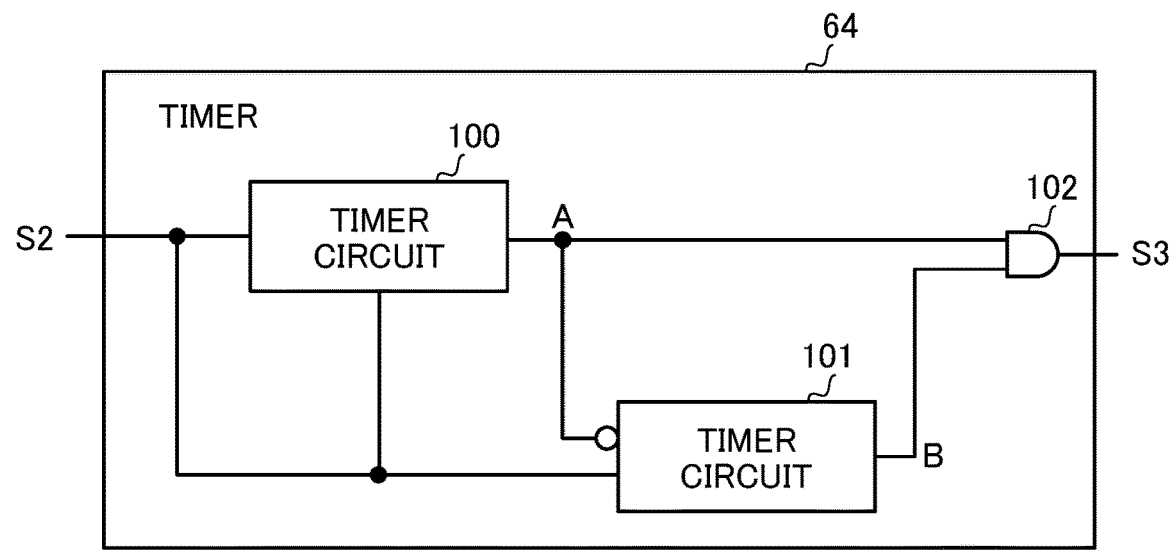
FIG. 4A is a diagram illustrating an example of a configuration of a timer 64.

FIG. 4A is a diagram illustrating an example of a configuration of the timer 64. The timer 64 controls an operation of the first constant current circuit 65. In specific, the timer 64 causes the first constant current circuit 65 to operate in the time period T1 and a time period T3 and to stop operating in the time period T2. The timer 64 includes timer circuits 100 and 101 and an AND element 102.

The timer circuit 100 measures the time period T1, which is a time period in which the first constant current circuit 65 and the second constant current circuit 66 operate. In specific, the timer circuit 100 is reset and outputs a high signal A, in response to the high signal S2. Meanwhile, the timer circuit 100 measures the time period T1 and outputs the low signal A, in response to the low signal S2. Upon finishing the measurement of the time period T1, the timer circuit 100 outputs the high signal A.

The timer circuit 101 measures the time period T2, which is a time period in which only the second constant current circuit 66 operates. In specific, the timer circuit 101 is reset and outputs a high signal B, in response to the high signal S2 or the low signal A. Meanwhile, the timer circuit 101 measures the time period T2 and outputs the high signal B, in response to the low signal S2 and the high signal A. Upon finishing the measurement of the time period T2, the timer circuit 101 outputs the low signal B.

The AND element 102 implements logical conjunction of the signals A and B, and outputs a resultant signal as the signal S3.

Figure 4B:
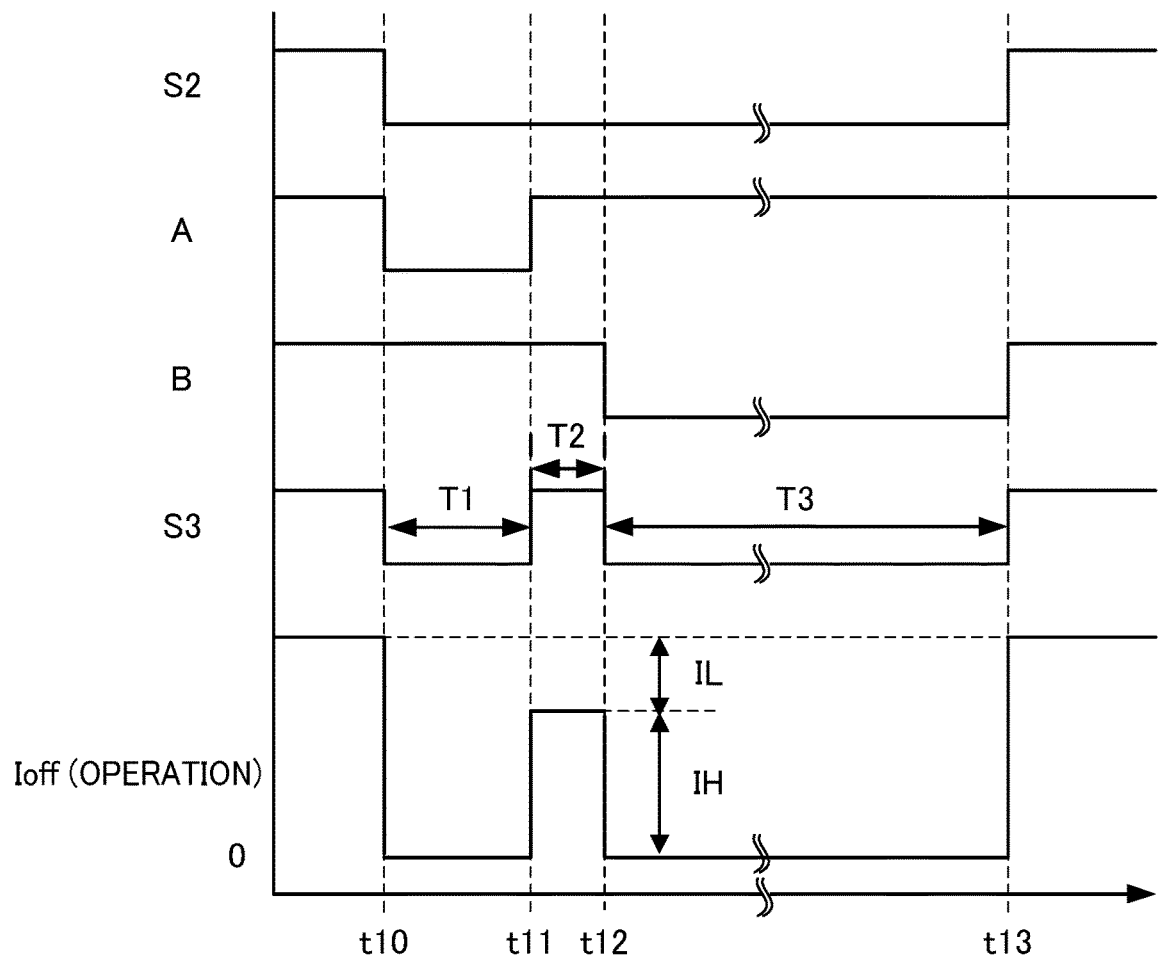
FIG. 4B is a diagram illustrating a timing chart of a timer 64 and a change in a constant current Ioff in association with an operation of a timer 64.

FIG. 4B is a diagram illustrating a timing chart of the timer 64 and change in the constant current Ioff in association with the operation of the timer 64. Note that, before a clock time t10, the constant current Ioff is 0 A.

In response to the delay circuit 63 outputting the low signal S2 at time t10, the timer circuit 100 outputs the low signal A and measures the time period T1. As a result, the AND element 102 outputs the low signal S3. At this time, the parasitic capacitance Cp of the IGBT 43 is discharged with the constant current Ioff that is the sum of the current IH passed by the first constant current circuit 65 and the current IL passed by the second constant current circuit 66. It is assumed that the currents flowing in the directions of the constant currents Ioff, IL, and IH given in FIG. 3 are negative currents.

At time t11, at which the time period T1 has elapsed since the time t10, the timer circuit 100 finishes measuring the time period T1 and outputs the high signal A. At this time, in response to the delay circuit 63 outputting the low signal S2 as well as the timer circuit 100 outputting the high signal A, the timer circuit 101 starts measuring the time period T2 and outputs the high signal B. As a result, the AND element 102 outputs the high signal S3. At this time, the first constant current circuit 65 stops generating the current IH. Accordingly, the constant current Ioff results in the current IL, which is smaller than the constant current Ioff in the time period T1.

At time t12, at which the time period T2 has elapsed since the time t11, the timer circuit 101 finishes measuring the time period T2, and outputs the low signal B. As a result, the AND element 102 outputs the low signal S3. At this time, the first constant current circuit 65 operates and starts generating the current IH. The second constant current circuit 66 also operates and starts generating the current IL. Accordingly, the constant current Ioff results in a current that is the sum of the current IL and the current IH, which is the same current as the constant current Ioff in the time period T1. Note that the time period T2 is shorter than the time period T1.

However, at this time, the drive voltage Vdrx of the IGBT 43 that is applied to the drain electrodes of the NMOS transistors 83, 84, 93, and 94 is substantially 0 V. Accordingly, in actual, substantially no constant current Ioff flows, and the first constant current circuit 65 and the second constant current circuit 66 pull down the gate electrode of the IGBT 43 so as to maintain the drive voltage Vdrx at 0 V. In FIGS. 4A and 4B, the constant current Ioff is illustrated as if it flows in the time period T3 from time t12 to t13, for the sake of convenience. However, this indicates that each of the first constant current circuit 65 and the second constant current circuit 66 operates to generate a constant current.

At time t13, at which the time period during which the IGBT 43 is off ends, in response to the delay circuit 63 outputting the high signal S2, the timer circuits 100 and 101 output the high signals A and B, and the AND element 102 outputs the high signal S3. At this time, the first constant current circuit 65 stops generating the current IH, and the second constant current circuit 66 stops generating the current IL. Accordingly, the constant current Ioff reaches 0 A. Note that the time period T1 corresponds to a "first time period", the time period T2 corresponds to a "second time period", and the time period T3, which is from when the time period T2 has elapsed until when the time period during which the IGBT 43 is off ends, corresponds to a "third time period". The time period T3 is longer than the time periods T1 and T2.

Figure 5:
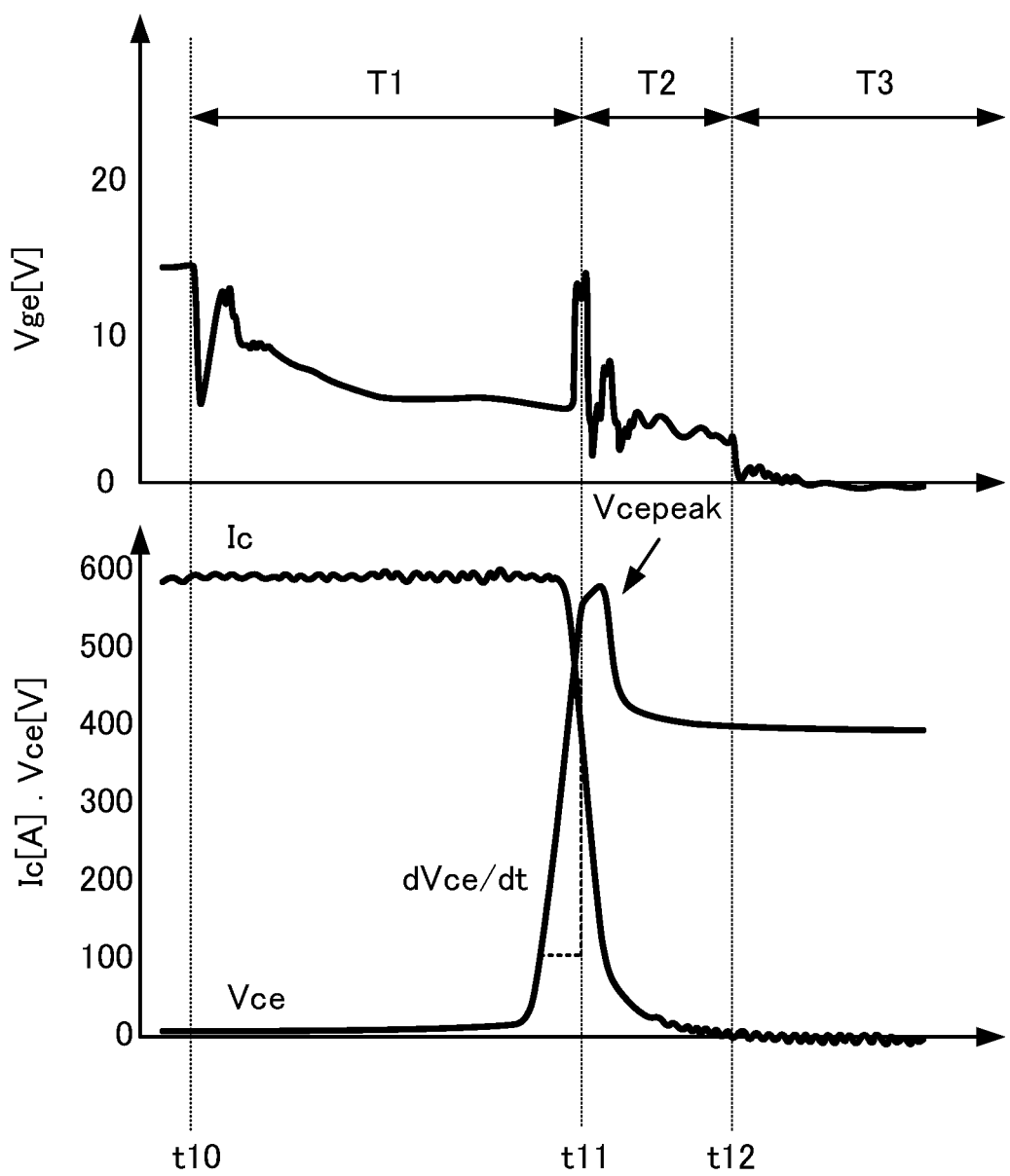
FIG. 5 is a diagram illustrating changes in voltages Vge and Vce and a collector current Ic when an IGBT 43 is driven by a constant current to be turned off.

Voltages Vge and Vce and Collector Current Ic when IGBT 43 is Driven by Constant Current to be Turned Off FIG. 5 is a diagram illustrating change in the voltages Vge and Vce and the collector current Ic when the IGBT 43 is driven by a constant current to be turned off. FIG. 5 illustrates time t10 to t12, illustrated in FIG. 4B, and thus the following description will be given with reference to FIG. 4B.

At time t10, at which the delay circuit 63 outputs the low signal S2, upon the timer 64 starting to measure the time period T1, the parasitic capacitance Cp is discharged, and thus the voltage Vge of the IGBT 43 gradually drops. Then, upon the on resistance of the IGBT 43 starting to increase, the voltage Vce starts to rise. In response to the parasitic capacitance Cp of the IGBT 43 being discharged with the constant current Ioff that is the sum of the current IL and the current IH, the rate of change dVce/dt of the voltage Vce per hour results in a constant value, and the voltage Vce rises.

This instantaneously increases the current flowing to the gate electrode of the IGBT 43 through the feedback capacitance Cres, and charges the input capacitance Cies. However, a time period from when the current having passed through the feedback capacitance Cres starts flowing until when the voltage Vce becomes stable (i.e., the Miller period) is short, because the OFF circuit 62 discharges the parasitic capacitance Cp with the constant current Ioff thereby quickly raising the voltage Vce.

At time t11, at which the delay circuit 63 outputs the low signal S2 and the timer circuit 100 outputs the high signal A, the timer 64 starts measuring the time period T2. Then, in response to the rate of change of the collector current Ic per hour (i.e., di/dt) rises, a peak voltage Vcepeak of the voltage Vce also rises.

In addition, when the parasitic capacitance Cp of the IGBT 43 is discharged with the constant current Ioff that is the current IL in the time period T2, the voltage Vge is affected by a parasitic inductor according to reduction in the constant current Ioff. Although the voltage Vge rises for a moment, the parasitic capacitance Cp is discharged with the constant current Ioff that is smaller than the constant current Ioff in the time period T1, and thus the peak voltage Vcepeak of the voltage Vce drops.

When the driver circuit 30x in an embodiment of the present disclosure drives the IGBT 43 by a constant current to turn off the IGBT 43, dVce/dt when the IGBT 43 is turned off is faster than that when the IGBT 43 is driven by constant voltage drive to be turned off. However, Vcepeak, which is a peak of the voltage Vce, drops based on the small constant current Ioff. Then, the area of the region indicating a switching loss Eoff surrounded by the voltage Vce and the collector current Ic decreases because the rise time of the voltage Vce is faster. As a result, the switching loss Eoff in a case of driving at the constant current is smaller than the switching loss Eoff in a case of driving by constant voltage drive.

Modification

In an embodiment of the present disclosure, the first constant current circuit 65 generates the current IH, and the second constant current circuit 66 generates the current IL. However, a configuration may include a constant current circuit for passing a current of the sum of the current IH and the current IL and a constant current circuit for passing the current IL, and either of the constant current circuits may be operated in response to the signal S3 and the like.

Summary

The motor control system 10 in an embodiment of the present disclosure has been described above. The driver circuit 30x includes the ON circuit 61 and the OFF circuit 62. The OFF circuit 62 discharges the parasitic capacitance Cp of the gate electrode of the IGBT 43 with the constant current Ioff in response to the low signal PWMx. This can shorten the Miller period in which a current passed through the feedback capacitance Cres of the IGBT 43 flows through the gate electrode, and reduce switching loss when the IGBT 43 is turned off. Consequently, it is possible to provide a driver circuit to reduce switching loss in a switching device.

In addition, the OFF circuit 62 discharges the parasitic capacitance Cp with the constant current Ioff, in the time period T1, in response to the low signal PWMx, and thereafter discharges the parasitic capacitance Cp with the current IL, which is smaller than the constant current Ioff, in the time period T2. This makes it possible to reduce the peak voltage Vcepeak of the voltage Vce while shortening the Miller period.

Moreover, the time period T2 is set shorter than the time period T1. This makes it possible to reduce the constant current Ioff in the time period in which the voltage Vcepeak is generated.

Furthermore, the OFF circuit 62 includes the timer 64, the first constant current circuit 65, and the second constant current circuit 66. This makes it possible to determine whether to operate each of the first constant current circuit 65 and the second constant current circuit 66, to thereby change the constant current Ioff for discharging the parasitic capacitance Cp of the IGBT 43.

In addition, the first constant current circuit 65 operates in a time period after the time period T2 has elapsed. This causes the gate electrode of the IGBT 43 to be pulled down to 0 V.

Moreover, the second constant current circuit 66 also operates in the time period after the time period T2 has elapsed. This enhances the performance of pulling down the gate electrode of the IGBT 43.

Furthermore, the time period T3 is longer than the time period T1 and the time period T2. This causes the gate electrode of the IGBT 43 to continue to be pulled down while the IGBT 43 is off in and after the time period T2.

In addition, the first constant current circuit 65 includes the NMOS transistors 83 and 84 and the NMOS transistor 82. This makes it possible to implement a function of the driver circuit 30x with a simple circuit.

Moreover, the second constant current circuit 66 includes the NMOS transistors 93 and 94 and the NMOS transistor 92. This makes it possible to implement a function of the driver circuit 30x with a simple circuit.

Furthermore, when the switching device is a MOS transistor, the parasitic capacitance Cp is a gate-source capacitance Cgs and a gate-drain capacitance Cgd. This also makes it possible to reduce switching loss in the MOS transistor in the driver circuit 30x.

The present disclosure is directed to provision of a driver circuit to reduce switching loss in a switching device.

According to the present disclosure, it is possible to provide a driver circuit to reduce switching loss in a switching device.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:

1. A driver circuit for driving a switching device having a control electrode, comprising:
    an ON circuit configured to turn on the switching device in response to a first drive signal; and
    an OFF circuit configured to discharge a parasitic capacitance of the control electrode of the switching device with a constant current, to turn off the switching device, in response to a second drive signal, wherein
    the constant current includes a first constant current, and a second constant current smaller than the first constant current; and
    the OFF circuit discharges the parasitic capacitance with the first constant current in a first time period, and thereafter discharges the parasitic capacitance with the second constant current in a second time period.

2. The driver circuit according to claim 1, wherein the second time period is shorter than the first time period.

3. The driver circuit according to claim 1, wherein the OFF circuit includes
    a timer configured to measure time in response to the second drive signal,
    a first constant current circuit configured to operate in the first time period to generate the first constant current, and stop operating in the second time period, in response to an output of the timer, and
    a second constant current circuit configured to operate to generate the second constant current in at least the second time period out of the first and second time periods.

4. The driver circuit according to claim 3, wherein the first constant current circuit operates in a third time period, the third time period being from when the second time period elapses to when a time period during which the switching device is off ends.

5. The driver circuit according to claim 4, wherein the second constant current circuit operates in the third time period.

6. The driver circuit according to claim 4, wherein the third time period is longer than the first time period, and longer than the second time period.

7. The driver circuit according to claim 4, wherein the first constant current circuit includes
    a first transistor provided between the control electrode and a ground, and
    a first control circuit configured to
        turn on the first transistor in the first and third time periods, and
        turn off the first transistor in the second time period.

8. The driver circuit according to claim 7, wherein the second constant current circuit includes
    a second transistor provided between the control electrode and the ground, and
    a second control circuit configured to turn on the second transistor in at least the second and third time periods.

9. The driver circuit according to claim 1, wherein the switching device is an insulated gate bipolar transistor (IGBT) or a metal-oxide-semiconductor (MOS) transistor, and
    the control electrode is a gate electrode.

10. A semiconductor device, comprising:
    a switching device having a control electrode;
    an ON circuit configured to turn on the switching device in response to a first drive signal; and
    an OFF circuit configured to discharge a parasitic capacitance of the control electrode of the switching device with a constant current, to turn off the switching device, in response to a second drive signal, wherein
    the constant current includes a first constant current, and a second constant current smaller than the first constant current; and
    the OFF circuit discharges the parasitic capacitance with the first constant current in a first time period, and thereafter discharges the parasitic capacitance with the second constant current in a second time period.

* * * * *